United States Patent [19]

Sako et al.

[11] Patent Number: 5,148,161
[45] Date of Patent: Sep. 15, 1992

[54] DIGITAL SIGNAL PROCESSOR FOR FIXED AND FLOATING POINT DATA

[75] Inventors: Kazuya Sako, Kakogawa; Masaaki Nagami; Shoji Fujimoto, both of Kobe, all of Japan

[73] Assignee: Fujitsu Ten Limited, Hyogo, Japan

[21] Appl. No.: 338,894

[22] Filed: Apr. 14, 1989

[30] Foreign Application Priority Data

Apr. 18, 1988 [JP] Japan .................................. 63-93349

[51] Int. Cl.⁵ ............................................. H03M 7/24
[52] U.S. Cl. ....................................... 341/93; 377/41
[58] Field of Search .................. 341/93, 100, 101, 50, 341/55, 89, 97; 377/41, 45

[56] References Cited

U.S. PATENT DOCUMENTS

| | | | |
|---|---|---|---|
| 3,786,490 | 1/1974 | Hallock | 341/93 |
| 4,520,347 | 5/1985 | Campbell | 341/93 |
| 4,733,591 | 3/1988 | Kaneko et al. | 84/1.01 |

FOREIGN PATENT DOCUMENTS

| | | |
|---|---|---|
| 58-86637 | 5/1983 | Japan . |
| 60-45841 | 3/1985 | Japan . |
| 61-109139 | 5/1986 | Japan . |

OTHER PUBLICATIONS

Analog to Digital Conversion Handbook, Analog Devices, pp. 183-186, 1986.

*Primary Examiner*—A. D. Pellinen
*Assistant Examiner*—B. K. Young
*Attorney, Agent, or Firm*—Nikaido, Marmelstein, Murray & Oram

[57] ABSTRACT

A digital signal processor comprises a code converter which converts an integer coded in a Binary Two's Complement (BTC) code to an integer coded in a Sign Magnitude Binary (SMB) code and/or a code converter which converts the SMB code to the BTC code. An integer coded in the BTC code and stored in an m-bits register is converted to an integer coded in the SMB code and input to an n-bits register, by an EXCLUSIVE OR processing of the bits with the sign bits and by supplementing a logic "1" in the less significant bit next to the least significant bit of the result of the exclusive OR operation. An integer coded in the SMB code and stored in an n-bits register is converted to an integer coded in the BTC code and input to an m-bits register, by an EXCLUSIVE OR processing of m−1 bits of magnitude bits with a sign bit. The code converters have a relatively simple construction, will not output an incorrect result, and are most suitable for processing AC signals.

13 Claims, 10 Drawing Sheets

DIGITAL SIGNAL PROCESSOR FOR FIXED AND FLOATING POINT DATA

BACKGROUND OF THE INVENTION

1. Field of the Invention

This invention relates to a digital signal processor. More particularly, this invention relates to a digital signal processor which can input and output both fixed point data and floating point data.

2. Description of the Related Art

A digital signal processor (referred to hereinafter as DSP) is a microprocessor which carries out high speed calculations of floating point data, to thereby carry out a software processing of data which can not be processed by a general-purpose microcomputer when a real time processing of an audio signal, high speed video processing, and a motor control which requires a complicated and high speed processing, is needed.

As the calculation of data in the DSP is executed mainly in the floating point form which consists of a sign bit, an exponential part, and a mantissa part, the data input/output is performed in a floating point form where the DSP inputs data from or outputs data to another DSP. Further, the DSP is mainly used for processing analog signals, as mentioned above, and therefore, an analog to digital (A/D) converter is provided in a stage preceding a DSP or a series of DSP's, and a digital to analog (D/A) converter is provided in a stage following a DSP or a series of DSP's. Accordingly, since the A/D and D/A converters usually deal with digital data as integers, in particular, an integer of 16 bits in a Binary Two's Complement (BTC) code (wherein the maximum is 011 . . . 111, the minimum is 100 . . . 000, and 0 is 000 . . . 000) in an audio signal processing, preferably a DSP connected to the A/D converter can input the integer of the BTC code, and the DSP connected to the D/A converter can output the integer of the BTC code, as well as the floating point data. Most preferably, the DSP can convert the BTC to a floating point and/or the floating point to the BTC, by hardware logic. Note, the scale of the circuit which implements the above function must be kept as small as possible.

It is well known that the conversion from the BTC to the floating point and from the floating point to the BTC is most easily executed in the form of a Sign Magnitude Binary (SMB) code (wherein the maximum is 011 111, the minimum is 111 . . . 111, +0 is 000 . . . 000, and −0 is 100 . . . 000), as described, for example, in Unexamined Patent Publication (Kokai) No. 61-109139, because the SMB and the floating point are easily interconverted by a bits shift and counting operation.

The BTC code can be converted to the SMB code by replacing all of the bits except for the most significant bit (MSB) or a sign bit with the result of an exclusive OR of the bits, except for the MSB (i.e., $F \leftarrow S \oplus F$: where F denotes the bits except for the MSB S denotes the MSB or a sign bit, and $\oplus$ denotes an EOR operator). The SMB code can be converted to the BTC code by the same process as used for the conversion from the BTC to the SMB code, i.e., $F \leftarrow S \oplus F$.

In the above process, however, a slight offset occurs when the value is negative. For example, 111 . . . 111 representing an integer −1 in the BTC code is converted to 100 . . . 000 which represents an integer −0 in the SMB code, and therefore, a means for executing an addition or subtraction of 1 is required to ensure an exact conversion. The exact conversion is performed in a circuit which implements $F \leftarrow F \oplus S + S$, and this circuit requires an adder having the same number of bits as that of the data.

The exact conversion circuit as mentioned above, will, however, output an incorrect result when a BTC code 100 . . . 000, which is lower limit among the integers represented in the BTC code, is converted to the SMB code; i.e., the result will be 000 . . . 000, which is far from the desired value.

SUMMARY OF THE INVENTION

An object of the present invention is to provide a digital signal processor comprising BTC to SMB and/or SMB to BTC code conversion circuits which are relatively simple and will not output an incorrect result as mentioned above.

In accordance with the present invention there is provided a digital signal processor comprising a first m-bits BTC code register, a first n-bits SMB code register where n > m, first exclusive OR gates, and logic "1" providing means. The first exclusive OR gates invert the outputs of the bits in the first m-bits register, except for the MSB if the MSB is logic "1". The logic "1" providing means supplements the inverted or non-inverted bits with a logic "1" at the less significant bit position next to the least significant bit of the inverted or non-inverted bits.

In accordance with the present invention there is also provided a digital signal processor comprising a second n-bits SMB code register, a second m-bits BTC code register, and second exclusive OR gates. The second exclusive OR gates invert the outputs of the bits in the second n-bits register, except for the MSB if the MSB is logic "1". The number of the exclusive OR gates is m-1, and the outputs thereof and the MSB of the second n-bits register are input to the second n-bits register.

In accordance with the present invention, there is further provided a digital signal processor comprising all of the components described above.

DESCRIPTION OF THE PREFERRED EMBODIMENTS

Before describing the preferred embodiments according to the invention, examples of aforementioned related art are given with reference to the accompanying drawings.

Figure 1:
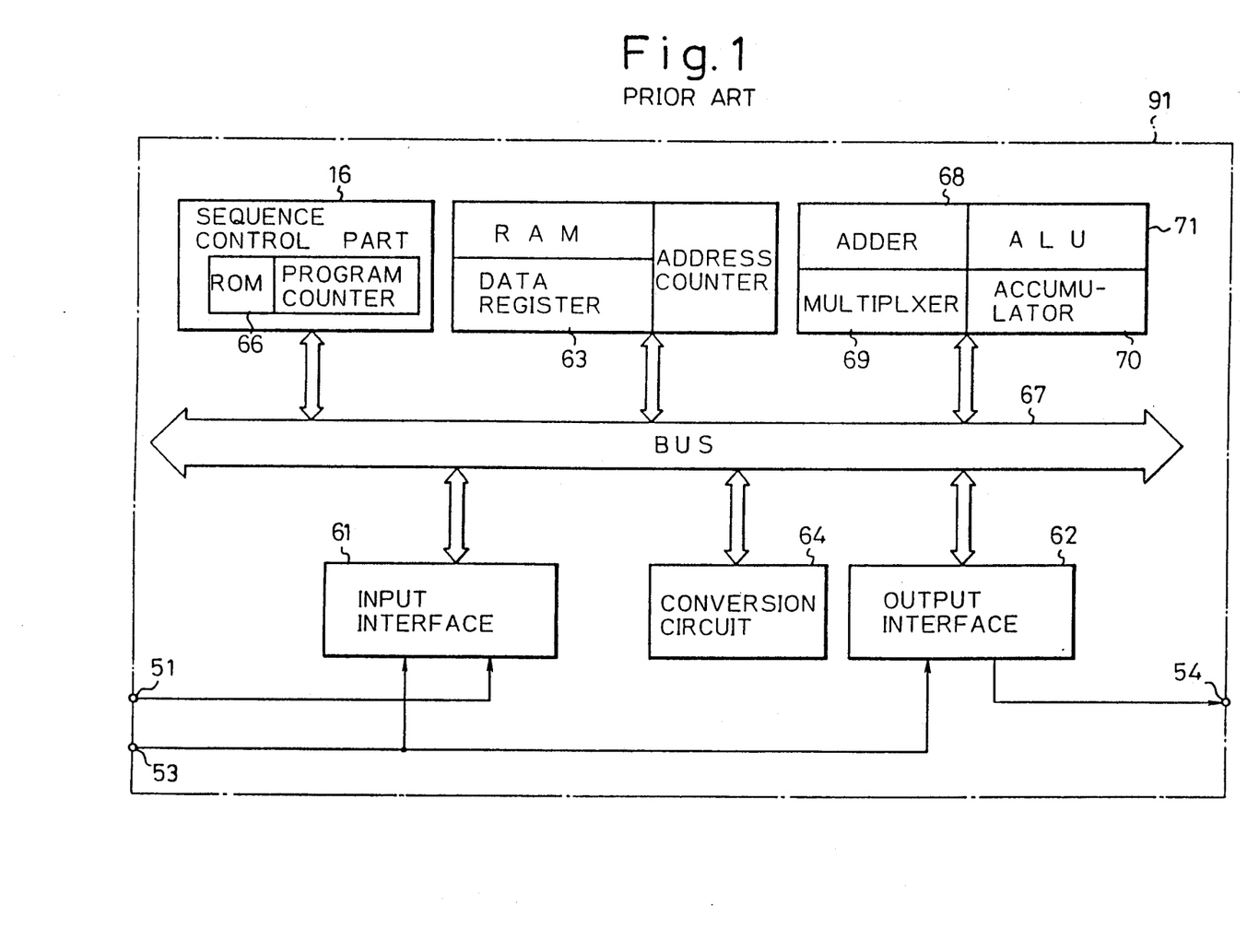
FIG. 1 is a schematic block diagram of the structure of a conventional DSP.

FIG. 1 is a schematic block diagram of the structure of a conventional DSP 91. A sequence control part 16 outputs various control signals for calculation and data input/output, etc. according to software instructions stored in a ROM 66 thereof. An arithmetic and logic unit (ALU) 71 performs high-speed product and sum operations (as $a_1x_1 + a_2x_2 \ldots$) in cooperation with an adder 68, a multiplier 69, and an accumulator 70. An input interface 61 samples serial data input from a data input terminal 51 in synchronization with an input/output clock input from a clock input terminal 53 and stores the data, independently of the sequence control part 16. The stored data is transferred to data registers 63, etc. in accordance with control signals from the sequence control part 16, is processed to carry out various calculations, and is output through an output interface to a data output terminal 54.

As the calculation step progressing in floating point form, data in the input interface 61 must be converted to floating points when the data represents an integer. If the integer is coded in the SMB code, it is converted directly to the floating point form by a conversion circuit 64 in accordance with control signals from the sequence control part 16. Where an integer coded in the BTC code is input from an A/D converter (not shown), the integer is converted at the data registers 63 to the SMB code form by a bit operation, in accordance with control signals from the sequence control part 16, i.e., in accordance with software instructions stored in the ROM 66, before conversion by the conversion circuit 64. Where the result of a calculation is output to a D/A converter (not shown), the floating point data is converted by conversion circuit 64 to the SMB code integer, which is converted at the data registers 63 to the BTC form by a bit operation in accordance with control signals from the sequence control part 16, i.e., in accordance with software instruction stored in the ROM 66.

Figure 2:
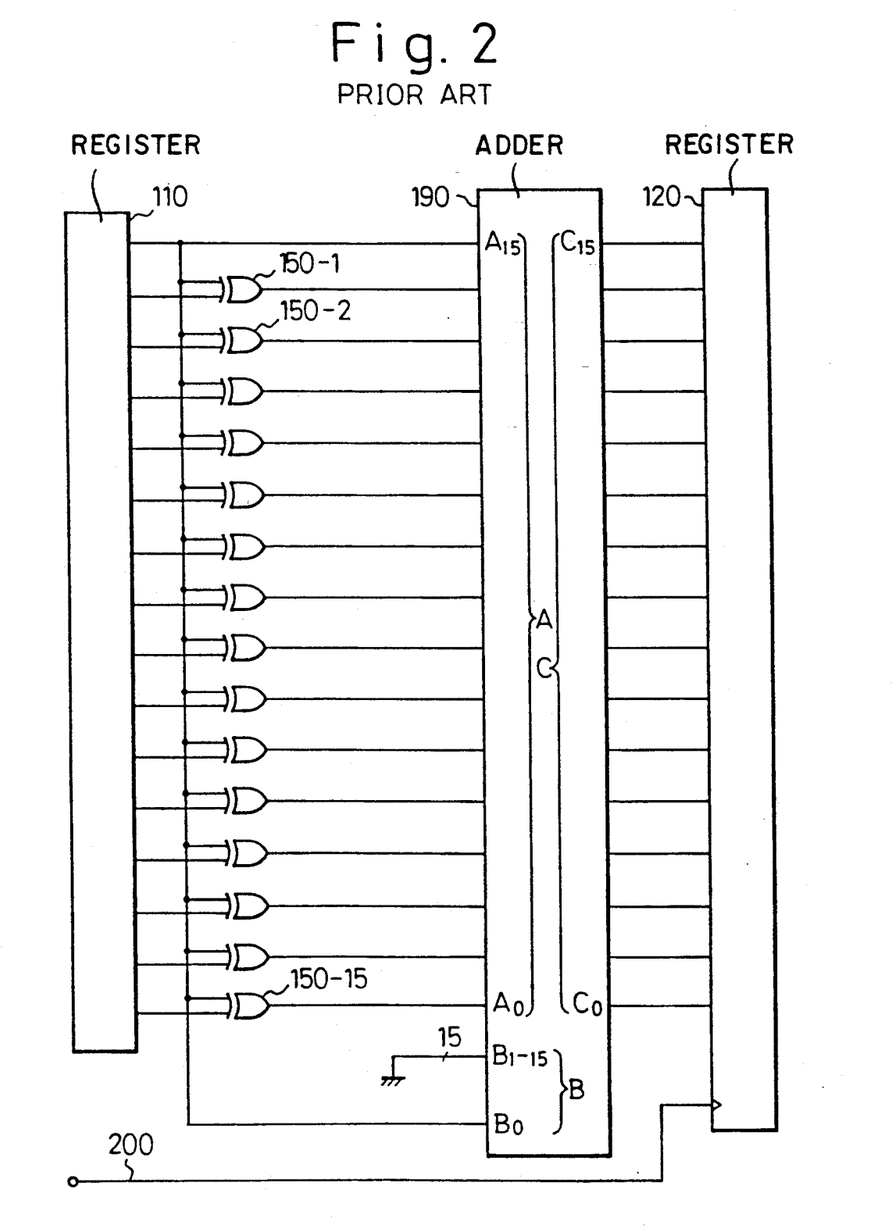
FIG. 2 is a circuit diagram showing an example of a circuit for converting a BTC code to an SMB code.

FIG. 2 shows an example of a circuit for converting the BTC code to the SMB code with hardware logic. The circuit performs the aforementioned exact conversion. In the figure, 110 is a 16-bit register for storing an integer coded in the BTC code, and consists of 16 flip-flops. The register 110 may be a shift register which converts serial input data to parallel data to input the serial input data. One input of each of the EOR gates 150-1 to 150-15 is connected to an output of the most significant bit (MSB) or a sign bit of the register 110. The other inputs of each of the EOR gates 150-1 to 150-15 are connected to outputs of the remaining bits, except for the sign bit, respectively. The 16 bit adder 190 arithmetically adds data B constructed from bits $B_0$ to $B_{15}$ to data A constructed from bits $A_0$ to $A_{15}$ to output data C constructed from bits $C_0$ to $C_{15}$. An input of the bit $B_0$ is connected to the output of the sign bit of the register 110 and inputs of the bits $B_1$ to $B_{15}$ are grounded. Accordingly, the data B becomes 1 when the data in the register 110 is negative, and the data B becomes 0 when the data in the register 110 is positive. An input of the bit $A_{15}$ is connected with the output of the sign bit of the register 110 and inputs of the bits $A_0$ to $A_{14}$ are connected with the output of the EOR gates 150-1 to 150-15. The inputs of a 16-bit register 120 are connected to the outputs of the adder 190. The register 120 may be a buffer register arranged between the input interface 61 and a internal bus 67 (FIG. 1).

In the circuit shown in FIG. 2, data exactly converted from the data in the register 110 is stored in the register 120 when a latch signal 200 for the register 120 is activated.

Figure 3:
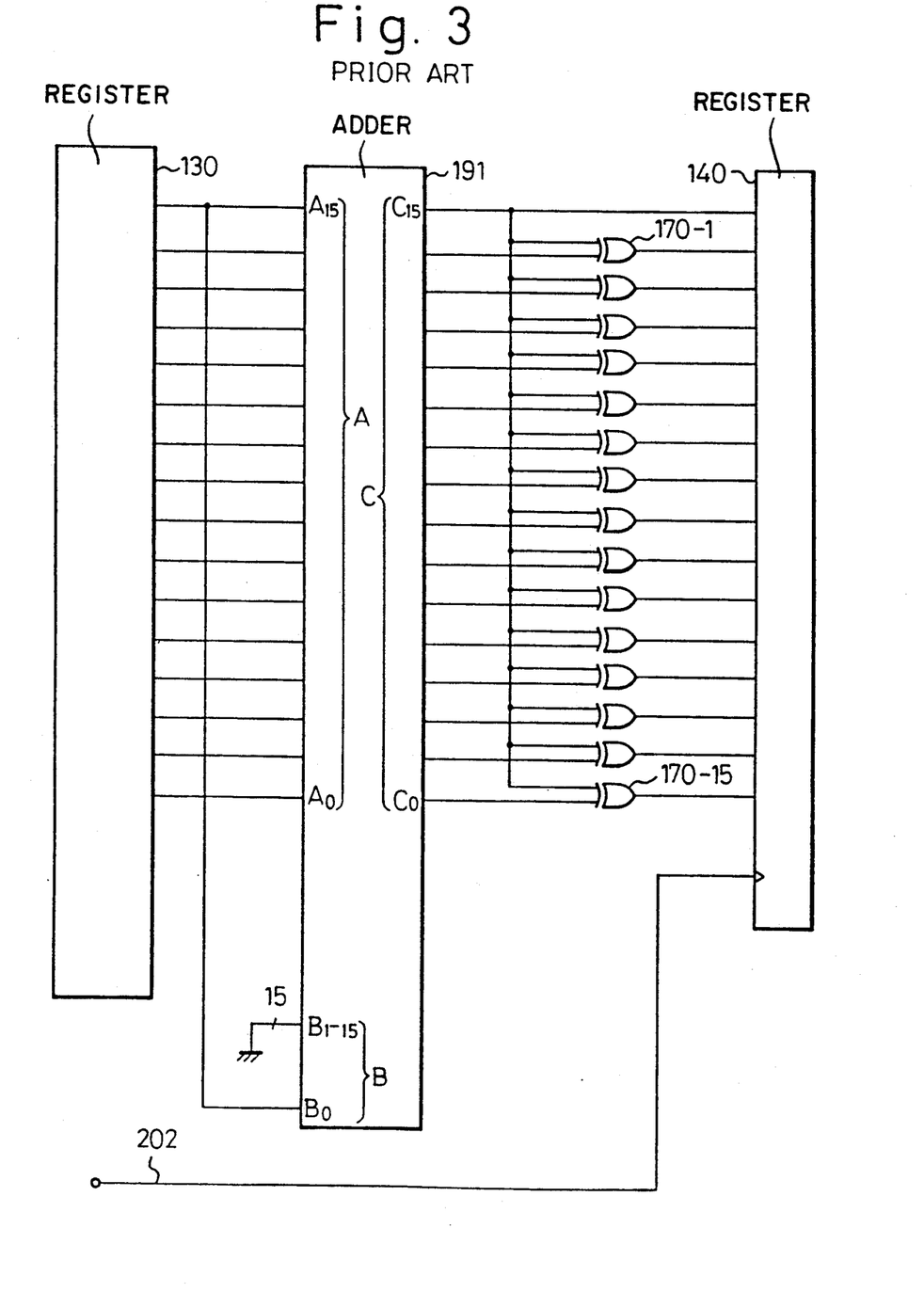
FIG. 3 is a circuit diagram showing an example of a circuit for converting the SMB code to the BTC code.

FIG. 3 shows an example of a circuit for converting the SMB code to the BTC code with hardware logic. In the figure, 130 is a 16-bit register for storing an integer coded in the SMB code. The register 130 may be a buffer register arranged between the internal bus 67 and the output interface 62 (FIG. 1). The 16-bit adder 191 has the same construction as the adder 190 shown in FIG. 2. An input of the bit $B_0$ is connected with an output of the sign bit of the register 130 and inputs of the bits $B_1$ to $B_{15}$ are grounded. Accordingly, the data B becomes 1 when the data in the register 130 is negative, and the data B becomes 0 when the data in the register 130 is positive. Inputs of bits $A_0$ to $A_{15}$ are connected to the outputs of the register 130, respectively. One input of each of the EOR gates 170-1 to 170-15 is connected to an output of the sign bit $C_{15}$ of the data C of adder 191, and the other inputs of each of the EOR gates 170-1 to 170-15 are connected to outputs of the bits $C_0$ to $C_{14}$ of the data C of adder 191. Converted data is stored in an 16-bit register 140. The register 140 may be a shift register which converts parallel data to serial data, to output the serial output data. An input of a sign bit of the register 140 is connected with the output of the bit $C_{15}$ of the data C of the adder 191, and the other inputs of the register 140 are connected with the outputs of the EOR gates 170-1 to 170-15, respectively.

In the circuit shown in FIG. 3, data exactly converted from the data in the register 130 is stored in the register 140 when a latch signal 202 for the register 140 is activated.

Figure 4A:
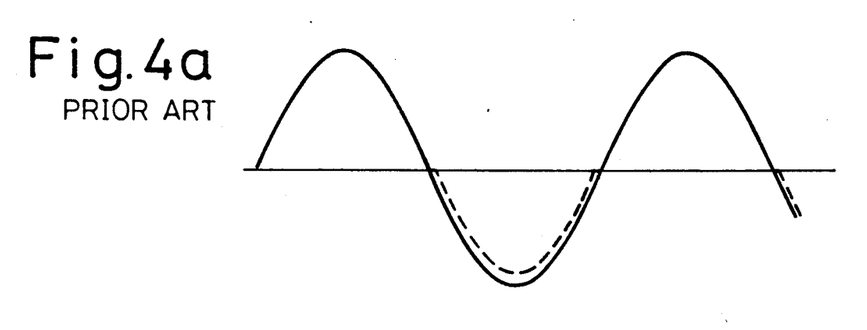
FIGS. 4a and 4b are diagrams explaining the problems of the related arts.
Figure 4B:
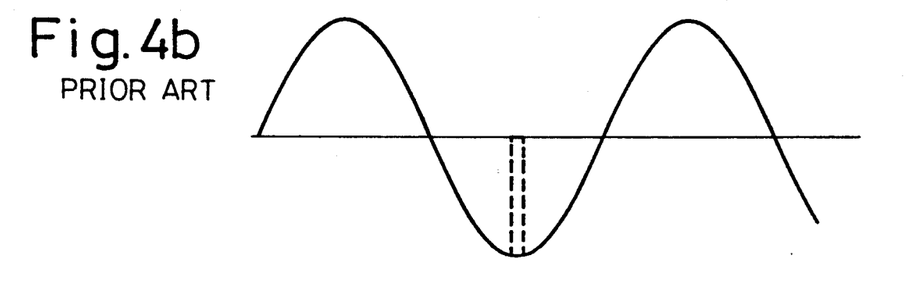

FIGS 4a and 4b show the problems of related art as mentioned above. A sine curves shown in FIG. 4(a) and 4(b) represent original data and a part of converted data. The highest points of the curves correspond to the maximum value of the integers represented in the BTC code, i.e., 011 . . . 111, and the lowest points of the curves correspond to the minimum value of the integers represents in the BTC code, i.e., 100 . . . 000. The chain lines in FIG. 4(a) represent an input A of the adder 190 (FIG. 2) when the data in register 110 is negative. Note, the distance thereof to the sine curve is emphasized. As shown in FIG. 4(a), the data A is slightly offset when negative, and thus an output signal of the DSP 91 is slightly distorted when close to the zero level.

The chain lines in FIG. 4(b) represent an output C of the adder 190, i.e., the result of a conversion in the circuit of FIG. 2 when the original data is at a minimum value (i.e., 100 . . . 000). Note, the width of an area formed by the chain lines is emphasized. As shown in FIG. 4(b), the circuit gives an incorrect, i.e., 000 . . . 000, when the original signal is equal to or higher than the lower limit.

The preferred embodiments of the present invention will now be described with reference to the accompanying drawings.

Figure 5:
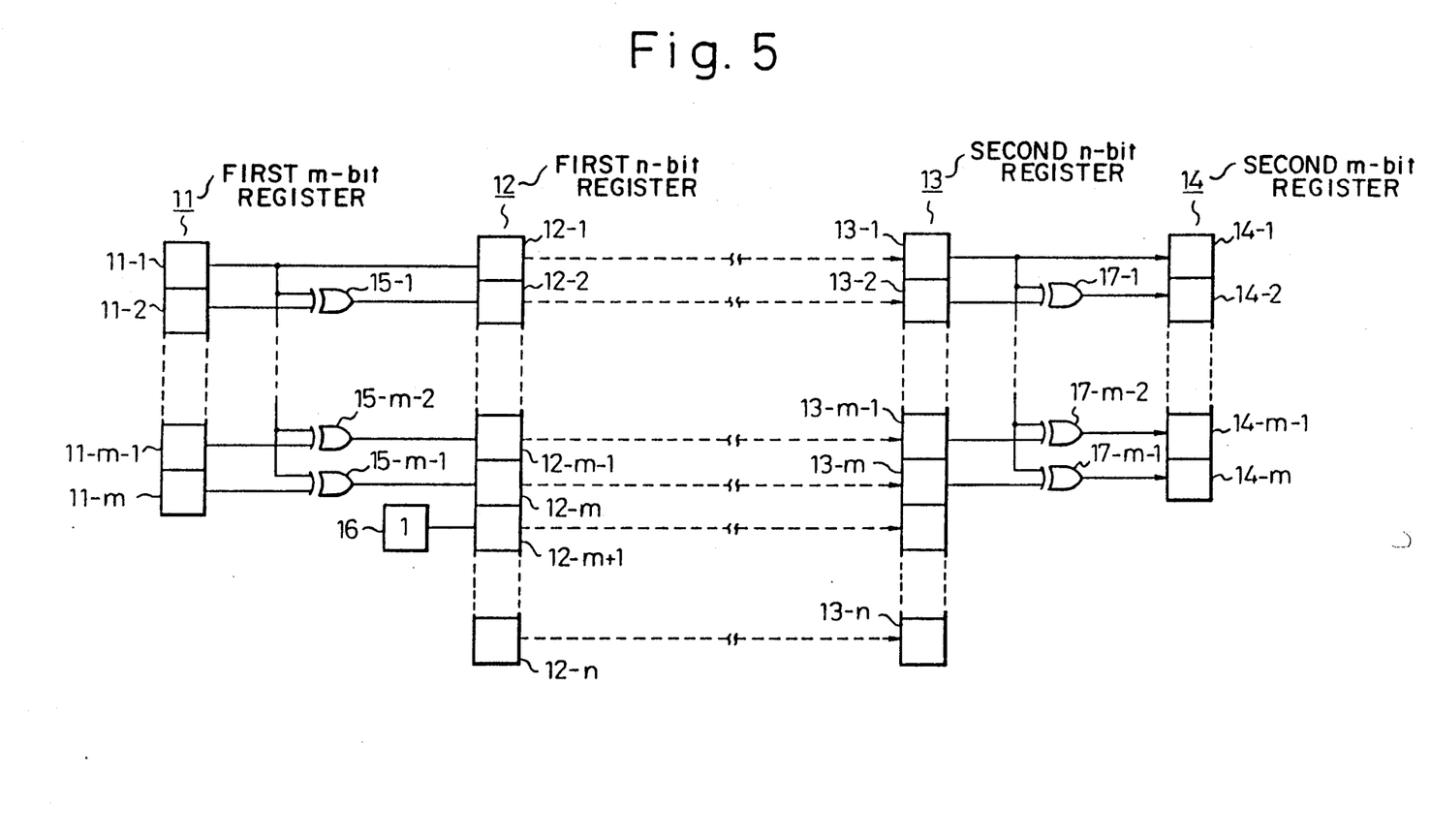
FIG. 5 is a block diagram of the basic construction of a BTC to SMB and an SMB to BTC code conversion circuit for a DSP, according to the present invention.

FIG. 5 shows a basic construction of a BTC to SMB and an SMB to BTC code conversion circuits for a DSP, according to the invention.

The circuit for converting the BTC code to an SMB code, comprises a first m-bit register 11, first exclusive OR gates 15-1 to 15-m-1, a first n-bit SMB code register 12, where n>m, and means for providing a logic "1" 16. One input of each of the first exclusive OR gates 15-1 to 15-m-1 is connected to a sign bit 11-1 in the first m-bits register 11, and the other inputs of each of the first exclusive OR gates 15-1 to 15-m-1 are connected to bits, except for the sign bit, 11-2 to 11-m in the first m-bits register 11, respectively. The sign bit 11-1 in the first m-bits register 11 is connected to an input of a sign bit 12-1 in first n-bits register 12. The outputs of the first exclusive OR gates 15-1 to 15-m-1 are connected to inputs of the m-1 bits 12-2 to 12-m, except for the sign bit 12-1 and a least significant bit 12-n, in the first n-bits register 12. An output of the means for providing a logic "1" is connected to an input of a bit 12-m+1 which is the less significant bit next to the least significant bit 12-m of the m bits in the first n-bits register 12.

When the integer stored in the first m-bits register 11 is positive, or zero, the bits except for the sign bits pass through the gate 15-1 to 15-m-1. An absolute value of the converted data represented by the bits 12-2 to 12-n is increased by one half by the logic "1" providing means 16, and thus the integer stored in the first n-bits register 12 is incremented by one half. When the integer stored in the first m-bits register 11 is negative, the bits except for the sign bits are inverted at the gates 15-1 to 15-m-1. The absolute value of the converted data represented by the bits 12-2 to 12-m is increased by one half, and thus the integer stored in the first n-bits register 12 is decremented by one half.

Figure 6:
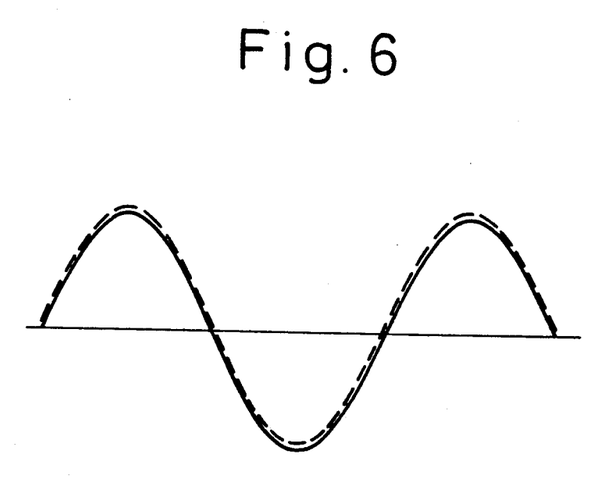
FIG. 6 is a diagram for explaining the conversion in the circuit shown in FIG. 5.

The effect of this increase and decrease is diagrammatically explained with reference to FIG. 4 and FIG. 6. In FIG. 6, the chain line curve represents a result of a conversion in the BTC to SMB conversion circuit in the DSP according to the present invention. The upper half of the curve in FIG. 4(a) is raised by one half and the chain line curve in FIG. 4(a) is lowered by one half, and becomes as shown by the chain line curve in FIG. 6. The chain line curve is not distorted and will not give an incorrect result as shown in FIG. 4(b), because the chain line curve does not reach the lower limit.

The circuit for converting an SMB code to a BTC code comprises a second n-bit register 13 storing an integer coded in the SMB code, second exclusive OR gates 17-1 to 17-m-1, and a second m-bit register 14 storing an integer coded in the BTC code, as shown in FIG. 5. One input of each of the second exclusive OR gates 17-1 to 17-m-1 is connected to a sign bit 13-1 in the second n-bits register 13, and the other inputs of each of the second exclusive OR gates 17-1 to 17-m-1 are connected to m-1 bits 13-2 to 13-m in the second n-bits register 13, respectively. The sign bit 13-1 in the second n-bits register 13 is connected to an input of a sign bit 14-1 in the second m-bits register 14. The outputs of the second exclusive OR gates 17-1 to 17-m-1 are connected to inputs of m-bits 14-2 to 14-m in the second m-bits register 14, except for the sign bit 14-1, respectively.

A bit in the second n-bits register 13 corresponding to the bit in the first n-bits register 12 connected to the logic "1" providing means 16 is not connected to the exclusive OR gates or the second m-bit register. Therefore, an increment caused by the conversion from BTC to SMB is eliminated upon a conversion from SMB to BTC, if an operation was not executed between the registers 12 and 13. Various arithmetic or logical operations, however, are naturally executed on the data stored in register 12, before a transfer thereof to the register 13, and therefore, the one half increment remains in the data stored in register 14. Nevertheless, this is a direct-type current, and thus this effect can be ignored as only the AC component is important in, for example, an audio signal process.

Figure 7:
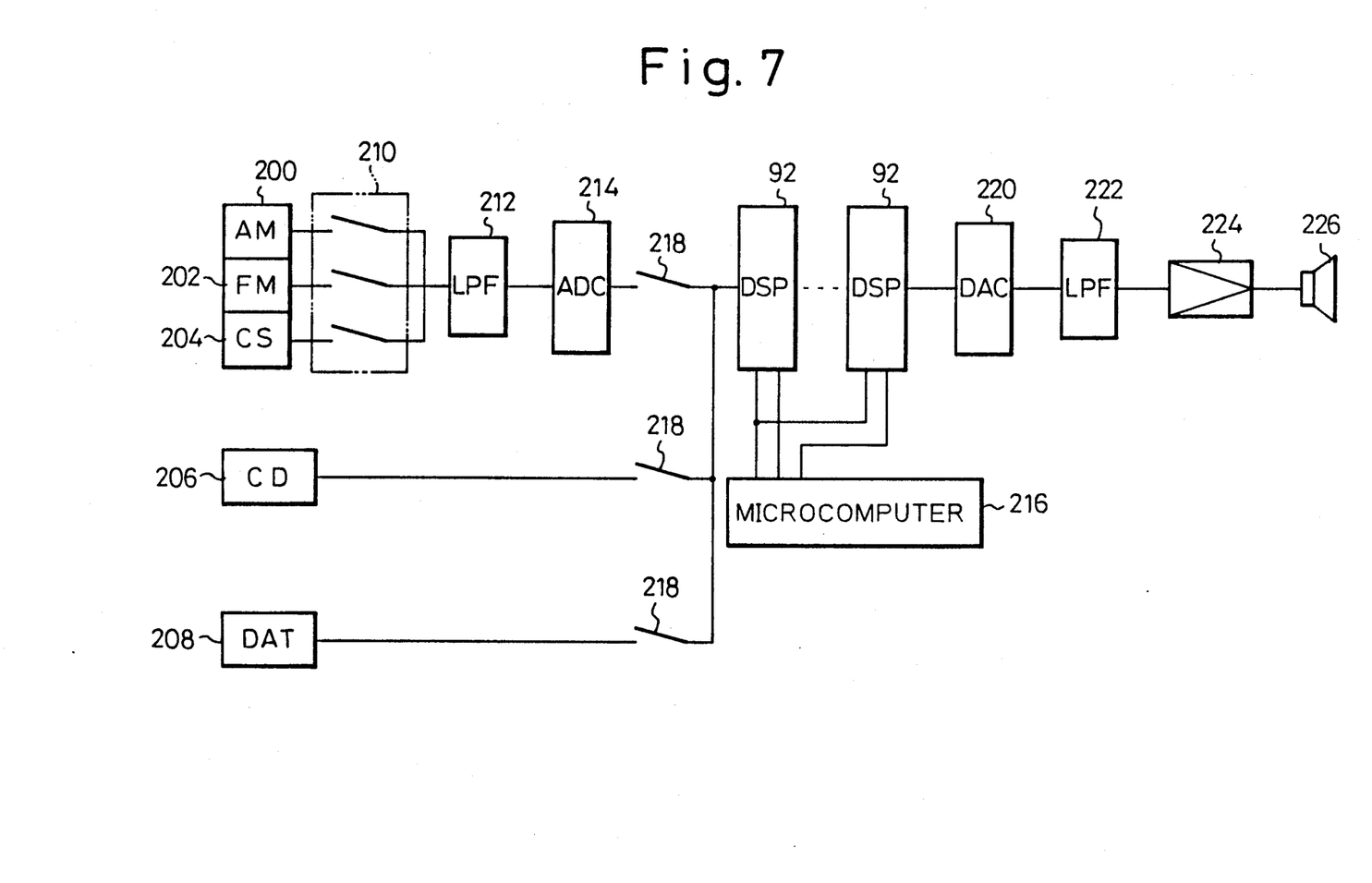
FIG. 7 is a block diagram of an audio system which comprises a plurality of DSP's according to the present invention.

FIG. 7 is a block diagram of an audio system which comprises a plurality of DSP's according to the present invention for controlling the sound quality and volume. The system comprises a plurality of sound sources such as an AM tuner 200, an FM tuner 202, a cassette tape deck (CS) 204, a compact disk (CD) player 206, and a digital audio tape deck (DAT) 208. The AM tuner 200, the FM tuner 202, and the cassette tape deck (CS) 204 output analog audio signals, which are passed through a switch 210 and input to a low-pass filter 212 which removes the high frequency component undesirable for a digital signal process. Signals output by the low-pass filter are input to an analog to digital (A/D) converter 214, which converts the analog signals to digital signals at predetermined intervals. The compact disk player 206 and the digital audio tape deck 208 output digital audio signals, which are passed through a switch 218, together with the output of the A/D converter 214, and input to the DSP's 92. The plurality of DSP's 92 are interconnected in serial, and at least a part of each of the DSP's 92 is connected to a microcomputer 216 which controls the DSP's 92. A signal output by the final stage of the DSP's 92 is input to a digital to analog (D/A) converter 220, which converts the digital signals to analog signals. A signal output by the D/A converter 220 is passed through a low-pass filter 222, amplified in an amplifier 224, and transferred to a speaker 226. In the DSP's 92, various operations are executed representedly within twenty to thirty micro-seconds, to implement the control of the sound quality and volume.

Figure 8:
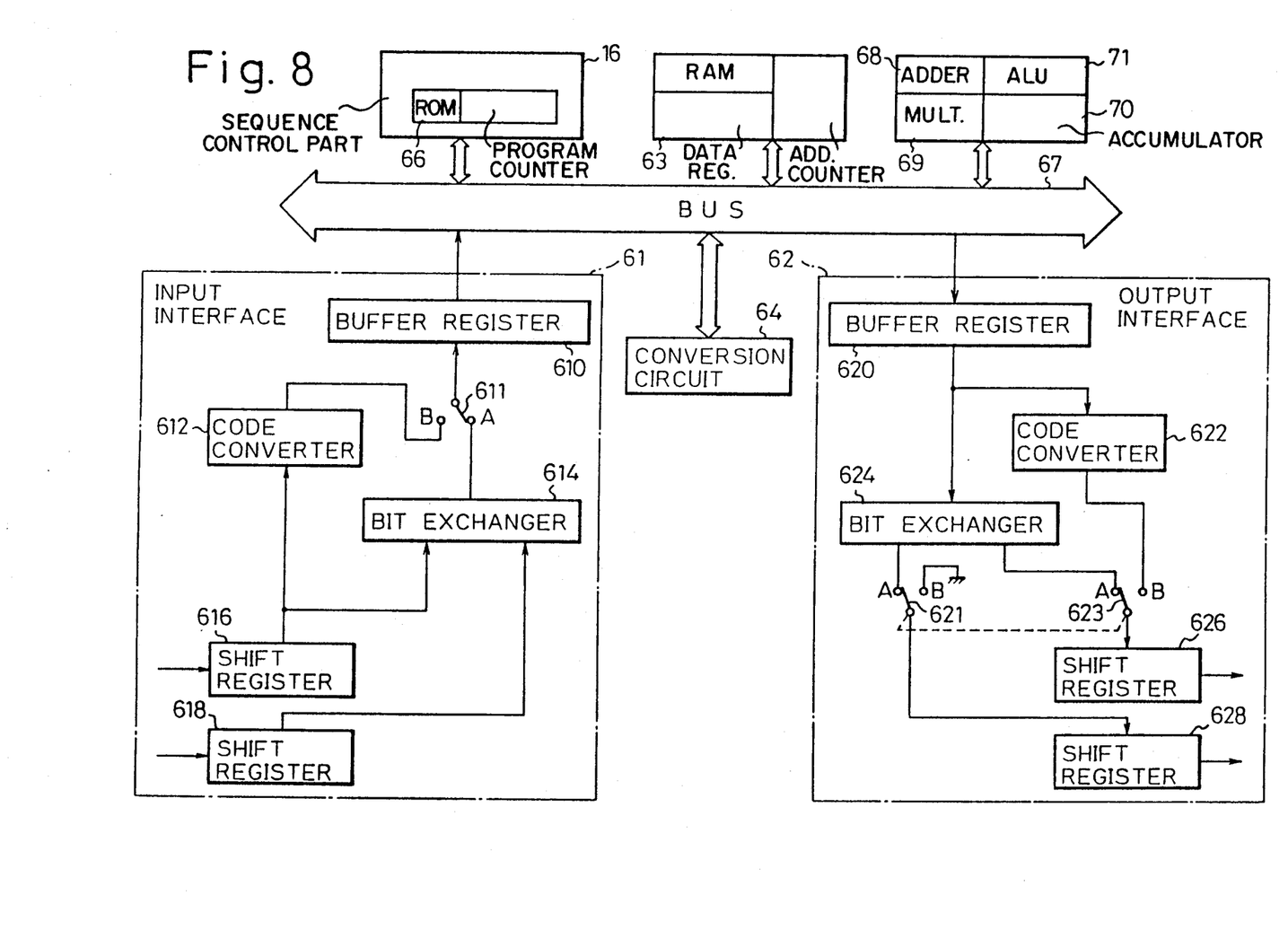
FIG. 8 is a block diagram of a detailed structure of a DSP according to the present invention.

FIG. 8 is a block diagram of the DSP 92 in FIG. 7. The same reference numerals as used in FIG. 1 are used for constituent which are similar to those in FIG. 1, and thus descriptions thereof are omitted.

The input interface 61 comprises two shift registers 616, 618, a bit exchanger 614, a code converter 612, a switch 611, and a buffer register 610. The shift registers 616, 618 convert serial input data to parallel data in synchronization with an input/output clock provided from outside of the DSP. The bit exchanger 614 rearranges the bit arrangement to bring the input floating data in line with the floating point format within the DSP. The code converter 612 converts the input integer in the BTC code to the MSB code. The switch 611 is provided with two contact point A and B, and when the input data is a real number, the contact A is used, and when the input data is an integer the contact B is used. The buffer register 610 is used to provide the real or integer number to the internal bus 67.

If the contact B is conductive, the data in the shift register 616 is continuously converted in the code converter 612 and sent to the buffer register 610. When a control signal for storing the input data to the data register 63, in a desired time is sent in accordance with a software instruction, an integer coded in the SMB code is stored in the data register 63, and is converted to the floating point format in the conversion circuit 64 in accordance with another software instruction.

The output interface 62 comprises a buffer register 620, a code converter 622, a bit exchanger 624, two switches 621 and 623, and two shift registers 626 and 628. The buffer register 620 is used to provided a real or integer number processed by the internal bus 67 and sent to the circuit for data output. The bit exchanger 624 rearrange the bit arrangement stored in the buffer register 620 to provide an arrangement which is the reverse of that provided by the bit exchanger 614. The code converter 622 converts an integer coded in the SMB code to the BTC code. Both switches 621 and 623 are provided with two contact points A and B, and when the output data is a real number, the contact A is used, and when the output data is an integer, the B is contact used, as in the switch 611. The contact A of the switch 621 is connected to a part of the outputs of the bit exchanger 624 and the contact B of the switch 621 is grounded. The contact A of the switch 623 is connected to another part of the outputs of the bit exchanger 624 and the contact B of the switch 623 is connected to the output of the code converter 622. Both switches 621 and 623 cooperate to provide a real number or an integer to the shift registers 626 and 628. The shift registers 626 and 628 convert parallel data stored therein to serial output data in synchronization with the input/output clock.

The result of operation in the DSP is converted in the conversion circuit 64 to an SMB form integer in accordance with a software instruction. When the SMB form integer is set in the buffer register 620, in a desired time, in accordance with a software instruction, the integer is converted to the BTC form in the code converter 622 and input to the shift register 626, if the contact B of the switch 626 is conductive. Then the data stored in the shift register 626 is converted to serial data and output.

Figure 9:
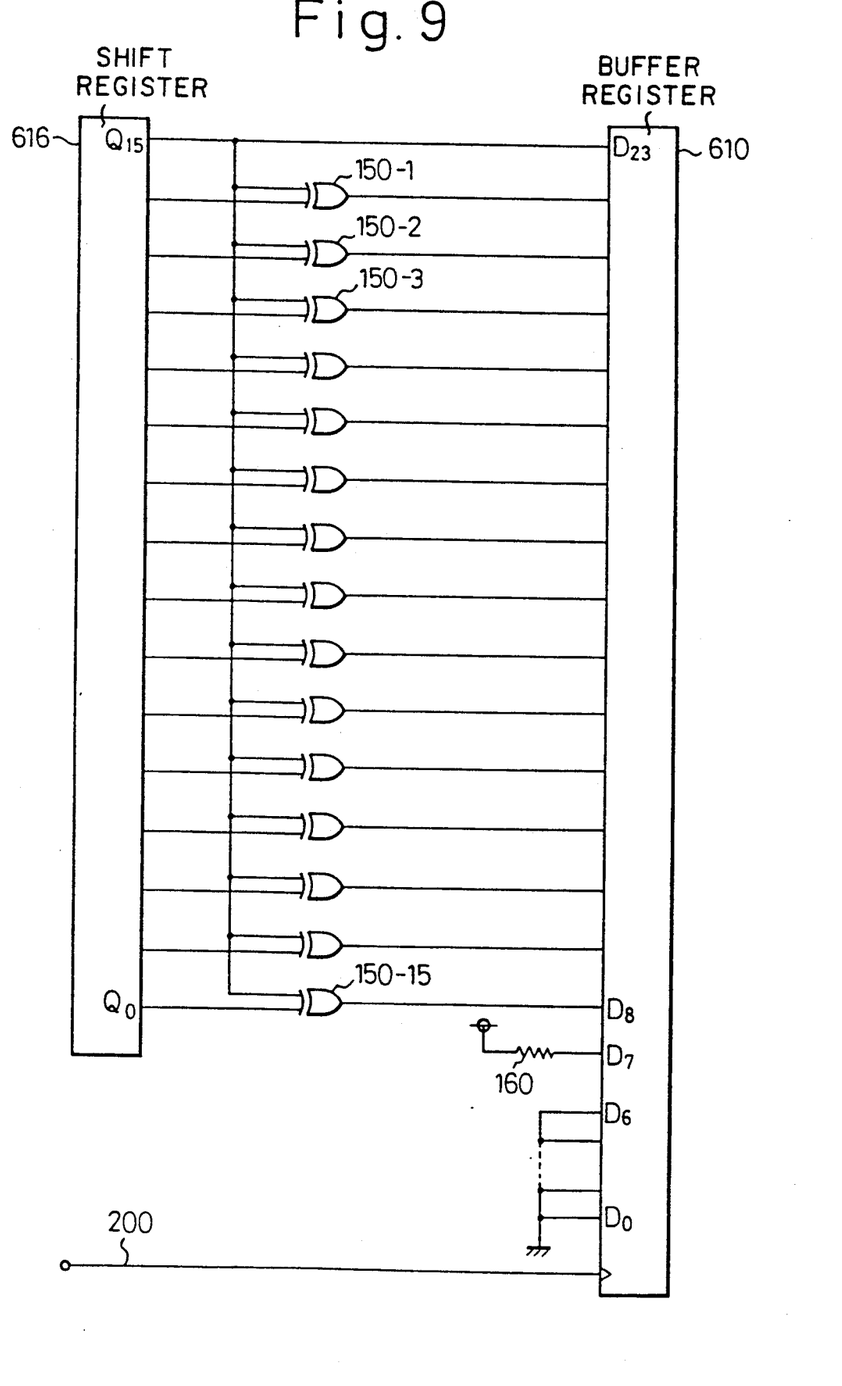
FIG. 9 is a circuit diagram of a detailed structure of the code converter 612 shown in FIG. 8.

FIG. 9 shows a detailed construction of the shift register 616, the code converter 612, and the buffer register 610, except for the switch 611. The most significant bit $Q_{15}$ of the shift register 616 is connected to the input of the most significant bit (MSB $D_{23}$ of the buffer register 610. One input of each of the exclusive OR gates 150-1 to 150-15 is connected to the MSB of the shift register 616, and the other inputs of each of the exclusive OR gates 150-1 to 150-15 are connected to the bits $Q_{14}$ to $Q_0$ in the shift register 616, respectively. The outputs of the exclusive OR gates are connected to inputs of the bits $D_{22}$ to $D_8$ in the buffer register 610, respectively. An input of a bit $D_7$ in the buffer register 610 is connected to a power source via a resister 160, and the inputs of the bits $D_6$ to $D_0$ are grounded.

When a latch signal 200 for the buffer register 610 is activated, the result of a conversion of an integer of the BTC code stored in the shift register 616 to the SMB code is stored in the buffer register 610, as explained before.

Figure 10:
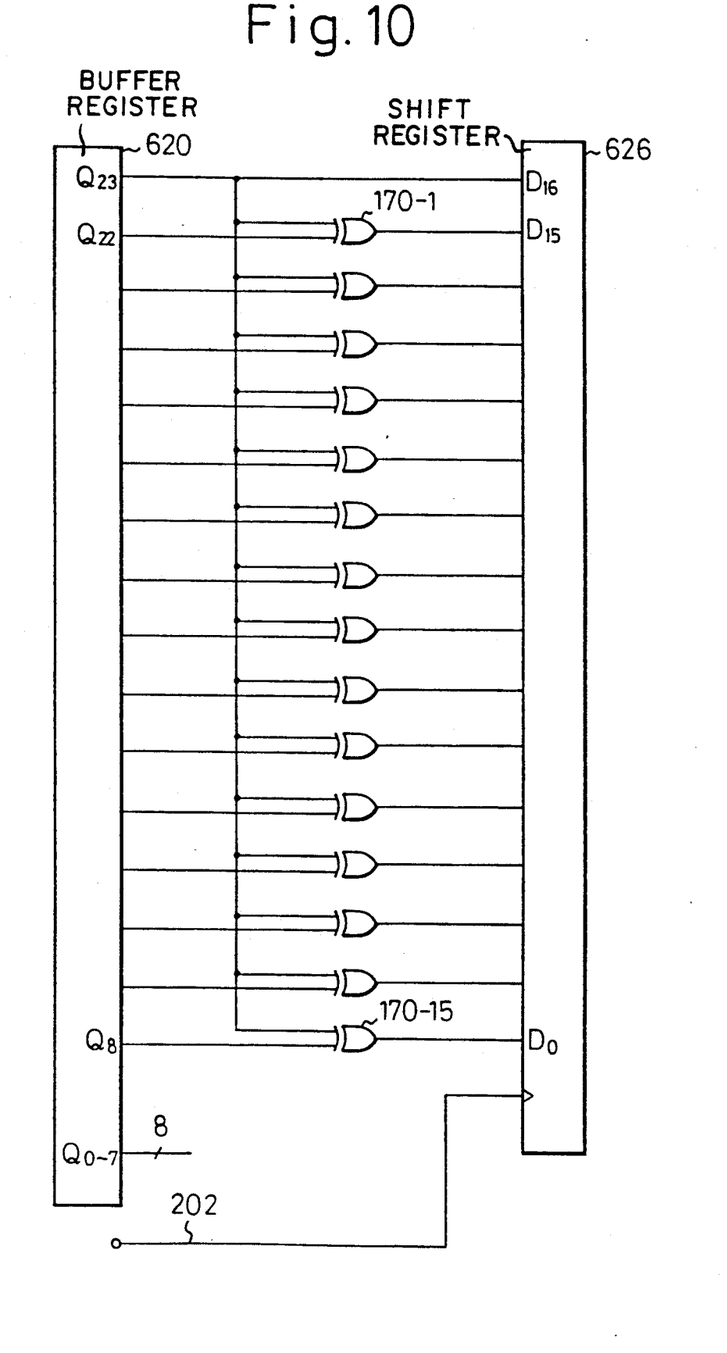
FIG. 10 is a circuit diagram of a detailed structure of the code converter 622 shown in FIG. 8.

FIG. 10 shows a detailed construction of the buffer register 620, code converter 622, and a shift register 626 except for the switch 623. The MSB $Q_{23}$ of the buffer register 620 is connected with an input of the MSB of the shift register 626. One input of each of the exclusive OR gates 170-1 to 170-15 is connected to the MSB of the buffer register 620, and the other inputs of each of the exclusive OR gates 170-1 to 170-15 are connected to the bits !$_{22}$ to $Q_8$ in the buffer register 620. The outputs of the exclusive OR gates 170-1 to 170-15 are connected to inputs of the bits $D_{15}$ to $D_0$ in the shift register 626.

When a latch signal 202 for the shift register 626 is activated, the result of a conversion of an integer of the SMB code stored in the buffer register 620 to the BTC code is stored in the shift register 626, as explained before.

We claim:

1. A digital signal processor comprising:

an m-bits register having m number of bits for storing an integer code in a Binary Two's complement code;

an n-bits register having n number of bits for storing an integer coded in Sign Magnitude Binary code, wherein n>m;

exclusive OR gates wherein one input of each of said exclusive OR gates is connected to a sign bit in said m-bits register and the other inputs of each of said exclusive OR gates are connected to m-1 bits in said m-bits register, except for the sign bit, respectively;

a logic "1" providing means for providing a logic "1" wherein the sign bit in said m-bits register is connected to an input of said sign bit in said n-bits register, outputs of said exclusive OR gates are connected to inputs of m-1 bits in said n-bits register, except for a) the sign bit of the n-bit register and b) the least significant bit of the n-bit register, respectively, and an output of said logic "1" providing means is connected to an input of a bit which is a less significant bit next to the last significant bit of said m-1 bits in said n-bits register.

2. A digital signal processor as claimed in claim 1, wherein said m-bits register is a shift register which converts serial data to parallel data.

3. A digital signal processor as claimed in claim 2, wherein said n-bits register is a buffer register, the contents of which are input to an internal bus.

4. A digital signal processor as claimed in claim 3, comprising a switch means, connected between said n-bits register and said m-bits register, for selecting an integer input mode or a real number input mode.

5. A digital signal processor comprising:

an n-bits register having n number of bits for storing an integer coded in Sign Magnitude Binary code;

an m-bits register having m number of bits for storing an integer coded in a Binary Two's Complement code, wherein m<n; and exclusive OR gates wherein one input of each of said exclusive OR gates is connected to a sign bit in said n-bits register and the other inputs of each of said exclusive OR gates are connected to m-1 bits in said n-bits register, respectively, wherein the sign bit in said n-bits register is connected to an input of a sign bit in said m-bits register, and outputs of said exclusive OR gates are connected to inputs of m-1 bits in said m-bits register, except for the sign bit of said m-bits register, respectively.

6. A digital signal processor as claimed in claim 5, wherein said m-bits register is a shift register which converts parallel data to serial data.

7. A digital signal processor as claimed in claim 5, wherein said n-bits register is a buffer register which receives data from an internal bus.

8. A digital signal processor as claimed in claim 7, comprising switch means, connected between said n-bits register and said m-bits register, for selecting an integer output mode or a real number output mode.

9. A digital signal processor comprising:

a first m-bits register having m number of bits for storing an integer coded in a Binary Two's complement code;

a first n-bits register having n number of bits for storing an integer coded in Sign Magnitude Binary code;

first exclusive OR gates wherein one input of each of said first exclusive OR gates is connected to a sign bit in said first m-bits register and the other inputs of each of said first exclusive OR gates are connected to m-1 bits in said first m-bits register, except for the sign bit, respectively;

a second n-bits register having n number of bits for storing an integer coded in Sign Magnitude Binary code;

a second m-bits register having m number of bits for storing an integer coded in a Binary Two's Complement code wherein m<n; and second exclusive OR gates wherein one input of each of said second exclusive OR gates is connected to a sign bit in said second n-bits register and the other inputs of each of said second exclusive OR gates are connected to said m-1 bits in said second n-bits register, respectively; and a logic "1" providing means for providing a logic "1", wherein the sign bit in said first m-bits register is connected to an input of a sign bit in said first n-bits register, outputs of said first exclusive OR gates are connected to inputs of m-1 bits in said first n-bits register, except for a) the sign bit of said first n-bits register and b) the least significant bit of said first n-bits register, respectively, an output of said logic "1" providing means is connected to an input of a bit which is a less significant bit next to the least significant bit of said m-1 bits in said first n-bits register, the sign bit in said second n-bits register is connected to an input of a sign bit in said second m-bits register, and outputs of said second exclusive OR gates are connected to inputs of m-1 bits in said second m-bits register, except for the sign bit in said second m-bits register, respectively.

10. A digital signal processor as claimed in claim 9, wherein said first m-bits register is a shift register which converts serial data to parallel data and said second m-bits register is a shift register which converts parallel data to serial data.

11. A digital signal processor as claimed in claim 10, wherein said first n-bits register is a buffer register the contents of which are sent to an internal bus and said second n-bits register is a buffer register which receives data from an internal bus.

12. A digital signal processor as claimed in claim 11, comprising a first switch means which, connected between said first n-bits register and said first m-bits register, for selecting an integer input mode or a real number input mode and a second switch means, connected between said second n-bits register and said second m-bits register, for selecting an integer output mode or a real number output mode.

13. A digital signal processor comprising:

an n-bits register having n number of bits for storing an integer coded in Sign Magnitude Binary code;

an m-bits register having m number of bits for storing an integer coded in a Binary Two's Complement code, wherein m<n;

a switch means, connected between said n-bits register and said m-bits register, for selecting an integer output mode or a real number output mode; and exclusive OR gates wherein one input of each of said exclusive OR gates is connected to a sign bit in said n-bits register and the other inputs of each of said exclusive OR gates are connected to m-1 bits in said n-bits register, respectively, wherein the sign bit in said n-bits register is connected to an input of a sign bit in said m-bits register, and outputs of said exclusive OR gates are connected to inputs of m-1 bits in said m-bits register, except for the sign bit of said m-bits register, respectively.

* * * * *